United States Patent
Doyle et al.

(10) Patent No.: US 9,081,137 B2
(45) Date of Patent: Jul. 14, 2015

(54) IMPLEMENTING EMBEDDED HYBRID ELECTRICAL-OPTICAL PCB CONSTRUCT

(71) Applicant: International Business Machines Corporation, Armonk, NY (US)

(72) Inventors: Matthew S. Doyle, Rochester, MN (US); Joseph Kuczynski, Rochester, MN (US); Kevin A. Splittstoesser, Stewartsville, MN (US); Timothy J. Tofil, Rochester, MN (US)

(73) Assignee: International Business Machines Corporation, Armonk, NY (US)

( * ) Notice: Subject to any disclaimer, the term of this patent is extended or adjusted under 35 U.S.C. 154(b) by 237 days.

(21) Appl. No.: 13/745,982

(22) Filed: Jan. 21, 2013

(65) Prior Publication Data

US 2014/0205232 A1     Jul. 24, 2014

(51) Int. Cl.
   *G02B 6/12*    (2006.01)
   *G02B 6/122*   (2006.01)
   *G02B 6/13*    (2006.01)
   *H05K 1/02*    (2006.01)

(52) U.S. Cl.
   CPC ........ *G02B 6/122* (2013.01); *G02B 6/13* (2013.01); *H05K 1/0274* (2013.01); *Y10T 156/10* (2015.01); *Y10T 156/1039* (2015.01)

(58) Field of Classification Search
   None
   See application file for complete search history.

(56) References Cited

U.S. PATENT DOCUMENTS

| | | |
|---|---|---|
| 6,343,172 B1 | 1/2002 | Schiestle et al. |
| 6,370,292 B1 | 4/2002 | Strake |
| 6,760,497 B1 | 7/2004 | Straub |
| 6,834,131 B2 | 12/2004 | Tourne |
| 7,212,698 B2 | 5/2007 | Bapst et al. |
| 7,529,448 B2 | 5/2009 | Chen et al. |
| 7,541,058 B2 | 6/2009 | Chan et al. |
| 7,589,880 B2 | 9/2009 | Kempa et al. |
| 7,936,953 B2 | 5/2011 | Johnson et al. |
| 8,159,824 B2 | 4/2012 | Cho et al. |
| 8,208,778 B2 | 6/2012 | deBlanc et al. |
| 8,249,402 B2 | 8/2012 | Asai et al. |
| 2008/0029879 A1* | 2/2008 | Tuckerman et al. .......... 257/704 |
| 2010/0039594 A1 | 2/2010 | Golan et al. |
| 2010/0330321 A1 | 12/2010 | Lin et al. |

(Continued)

FOREIGN PATENT DOCUMENTS

JP     2090108 A     3/1990

OTHER PUBLICATIONS

Copper foils for high frequency circuit material constructions by Rogers Corporation of Chandler, AZ. http://www.rogerscorp.com/documents/749/acm/Copper-Foils-for-High-Frequency-Circuit-Materials.aspx.

(Continued)

*Primary Examiner* — Tina Wong
(74) *Attorney, Agent, or Firm* — Joan Pennington

(57) ABSTRACT

Methods and structures are provided for implementing embedded hybrid electrical-optical printed circuit board (PCB) constructs. The embedded hybrid electrical-optical PCB construct includes electrical channels and optical channels within a single physical PCB layer. The embedded hybrid electrical-optical PCB construct includes an electrically conductive sheet or a copper sheet, and a reflective mesh adhesive layer provided with the electrical channels and optical channels within the single physical PCB layer.

18 Claims, 4 Drawing Sheets

(56) References Cited

U.S. PATENT DOCUMENTS

2011/0234421 A1    9/2011    Smith
2013/0037721 A1*    2/2013    Ouchi ........................... 250/353

OTHER PUBLICATIONS

Copper foils by Gould Electronics of Hauptstrasse 3 79356 Eichstetten, Germany, http://www.gould.com/products/reverse-treated-copper/rtc/pub_export?lang=eng&export_format=pdfgould.

Optically transparent PSAs by 3M Optical Systems, http://solutions.3m.com/wps/portal/3M/en_US/elctronics/home/productsandservices/products/ProductNavigator/TapeAdhesives/?PC_7_RJH9U5230GE3E02LECIE20KHO6000000_nid=HL9897BZX5beG7W0C8BLTFgl.

Optical films by 3M Optical Systems, http://solutions.3m.com/wps/portal/3M/en_US/NA_Optical/Systems/Technology/DisplayFilms/.

Optically transparent PSAs by Drytac Facemount of Richmond, Virginia, http://www.drytac.com/mounting-adhesives/facemount.html.

* cited by examiner

US 9,081,137 B2

IMPLEMENTING EMBEDDED HYBRID ELECTRICAL-OPTICAL PCB CONSTRUCT

FIELD OF THE INVENTION

The present invention relates generally to the data processing field, and more particularly, relates to methods and structures for implementing an embedded hybrid electrical-optical printed circuit board (PCB) construct.

DESCRIPTION OF THE RELATED ART

As used in the present specification and claims, the terms circuit board, printed circuit board or PCB means a substrate or multiple layers (multi-layer) of substrates used to electrically attach electrical components and should be understood to generally include circuit cards, printed circuit cards, backplanes, printed wiring cards, printed wiring boards, flex circuits, and ceramic or organic chip packaging substrates.

Prior art processes exist to create electrical and optical channels within multiple adjacent layers of a printed circuit board. However, there is a challenge to create electrical and optical channels within the same physical PCB layer. Equally important is to create the structure in a cost-effective manner utilizing existing manufacturing processes.

A need exists for implementing embedded hybrid electrical-optical PCB structures without requiring additional physical layers. It is desirable to provide such structures that maintain the use of existing PCB manufacturing processes.

SUMMARY OF THE INVENTION

Principal aspects of the present invention are to provide methods and structures for implementing embedded hybrid electrical-optical PCB constructs. Other important aspects of the present invention are to provide such methods and structures substantially without negative effects and that overcome many of the disadvantages of prior art arrangements.

In brief, methods and structures are provided for implementing embedded hybrid electrical-optical printed circuit board (PCB) constructs. The embedded hybrid electrical-optical PCB construct includes electrical channels and optical channels within a single physical PCB layer. The embedded hybrid electrical-optical PCB construct includes an electrically conductive sheet or a copper sheet, and a reflective mesh adhesive layer provided with the electrical channels and optical channels within the single physical PCB layer.

In accordance with features of the invention, the electrical and optical channels are provided without growing the PCB cross-section or Z-axis height, which is advantageous from mechanical, yield, reliability and cost perspectives.

In accordance with features of the invention, the embedded hybrid electrical-optical PCB construct maintains the use of existing PCB manufacturing processes.

BRIEF DESCRIPTION OF THE DRAWINGS

The present invention together with the above and other objects and advantages may best be understood from the following detailed description of the preferred embodiments of the invention illustrated in the drawings, wherein.

DETAILED DESCRIPTION OF THE PREFERRED EMBODIMENTS

In the following detailed description of embodiments of the invention, reference is made to the accompanying drawings, which illustrate example embodiments by which the invention may be practiced. It is to be understood that other embodiments may be utilized and structural changes may be made without departing from the scope of the invention.

The terminology used herein is for the purpose of describing particular embodiments only and is not intended to be limiting of the invention. As used herein, the singular forms "a", "an" and "the" are intended to include the plural forms as well, unless the context clearly indicates otherwise. It will be further understood that the terms "comprises" and/or "comprising," when used in this specification, specify the presence of stated features, integers, steps, operations, elements, and/or components, but do not preclude the presence or addition of one or more other features, integers, steps, operations, elements, components, and/or groups thereof.

In accordance with features of the invention, methods and structures are provided for implementing embedded hybrid electrical-optical PCB constructs.

Figure 1:
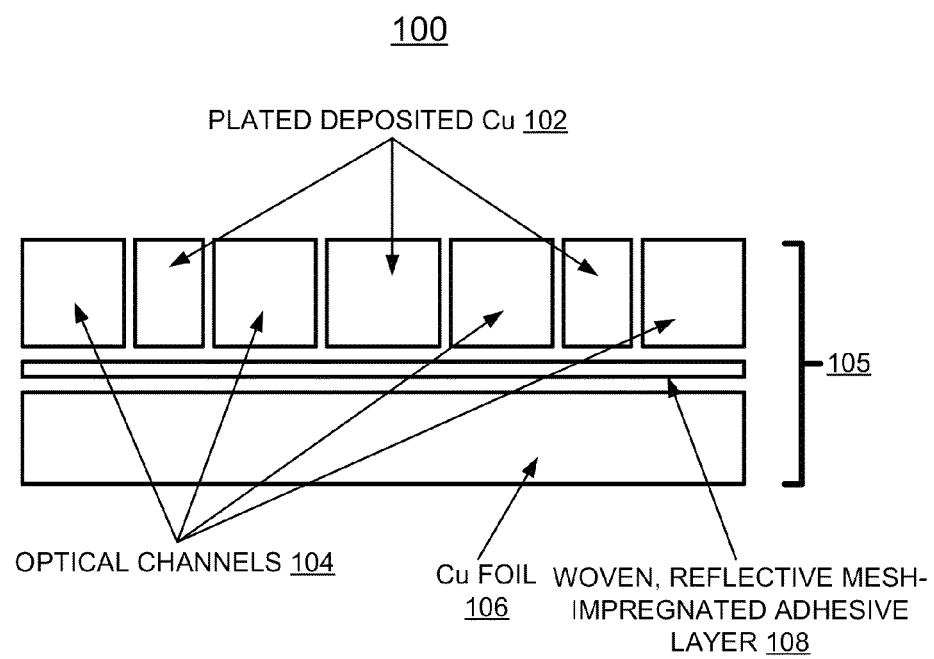
FIG. 1 is a side view not to scale schematically illustrating an example embedded hybrid electrical-optical PCB construct in accordance with a preferred embodiment.
Figure 2:
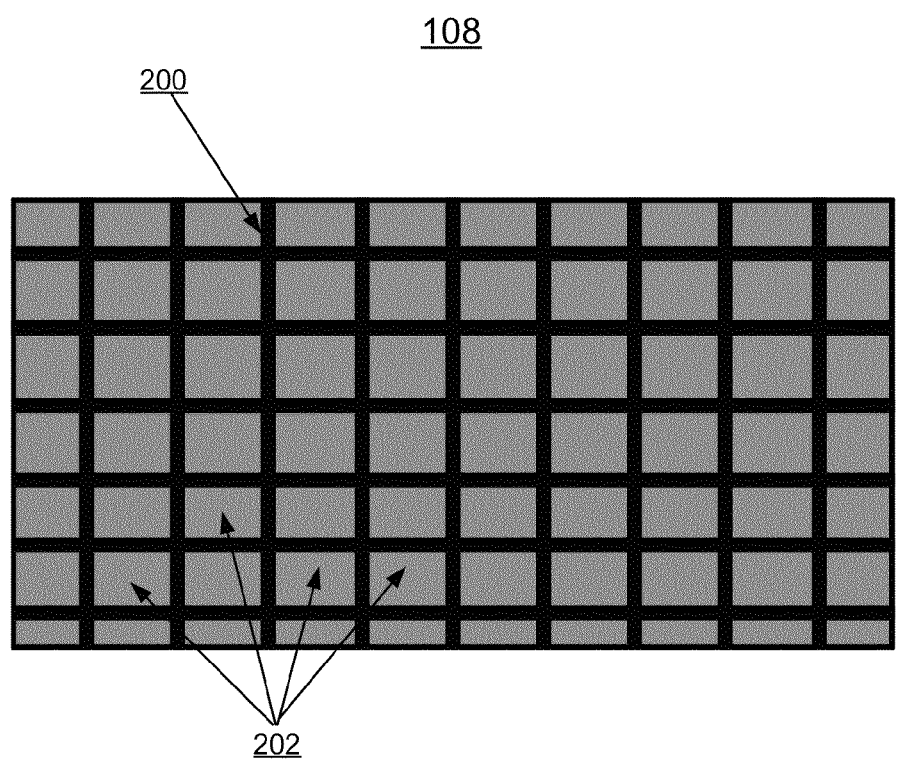
FIG. 2 is a fragmentary plan view not to scale schematically illustrating an example woven, reflective mesh-impregnated adhesive layer of the structure of FIG. 1 in accordance with a preferred embodiment.
Figure 3:
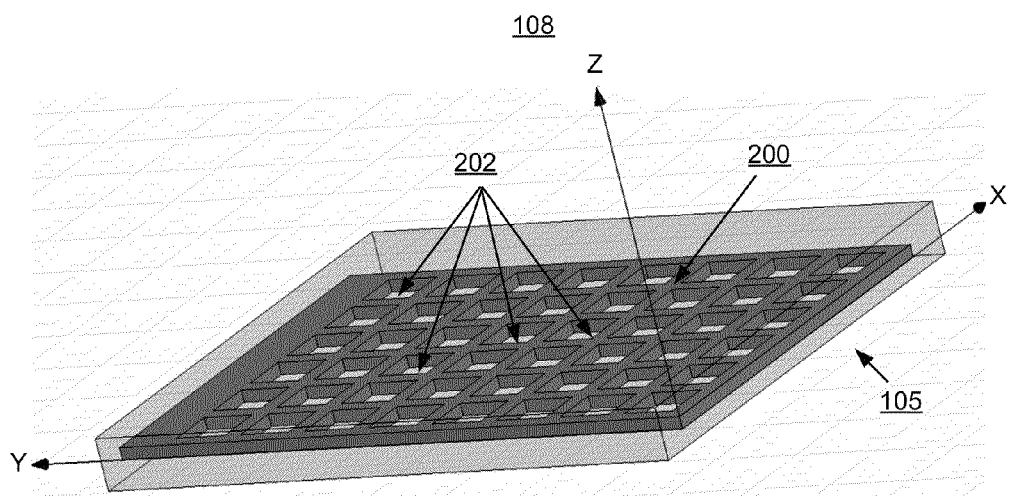
FIG. 3 is a fragmentary perspective view not to scale schematically illustrating example woven, reflective mesh-impregnated adhesive layer of the structure of FIG. 1 in accordance with a preferred embodiment.

Referring now to FIGS. 1-3, there is shown an example embedded hybrid electrical-optical PCB construct structures generally designated by the reference character 100 in accordance with preferred embodiments.

Embedded hybrid electrical-optical PCB construct 100 includes a plurality of electrical channels 102 interleaved with a plurality of optical channels 104 within a single physical PCB layer 105. The embedded hybrid electrical-optical PCB construct 100 includes an electrically conductive sheet or copper sheet 106, and a reflective mesh adhesive layer 108 provided with the electrical channels 102 and optical channels 104 within the single physical PCB layer 105.

For example, the plurality of electrical channels 102 within the single physical PCB layer 105 are defined by plated deposited copper (Cu). The plurality of optical channels 104 are defined within the single physical PCB layer 105 interleaved between the electrical channels 102. The copper sheet 106 includes a standard Cu foil sheet, such as 1 oz., 2 oz., and the like. The reflective mesh adhesive layer 108 includes a woven, reflective mesh-impregnated adhesive layer.

Referring to FIGS. 2 and 3, there are shown a fragmentary plan view and perspective view not to scale schematically illustrating the example woven, reflective mesh-impregnated adhesive layer 108 of the embedded hybrid electrical-optical PCB construct 100 in accordance with a preferred embodiment.

As shown in FIGS. 2 and 3, the example woven, reflective mesh-impregnated adhesive layer 108 is a grid structure including a mesh trace structure or mesh sidewall structure generally designated by the reference character 200 defining a plurality of mesh cavities or mesh holes 202.

In accordance with features of the invention, the electrical and optical channels are provided without growing the PCB cross-section or Z-axis height of the single physical PCB layer 105, which is advantageous from mechanical, yield, reliability and cost perspectives. In FIG. 3, X-axis, Y-axis, and Z-axis are illustrated with the single physical PCB layer 105.

Figure 4:
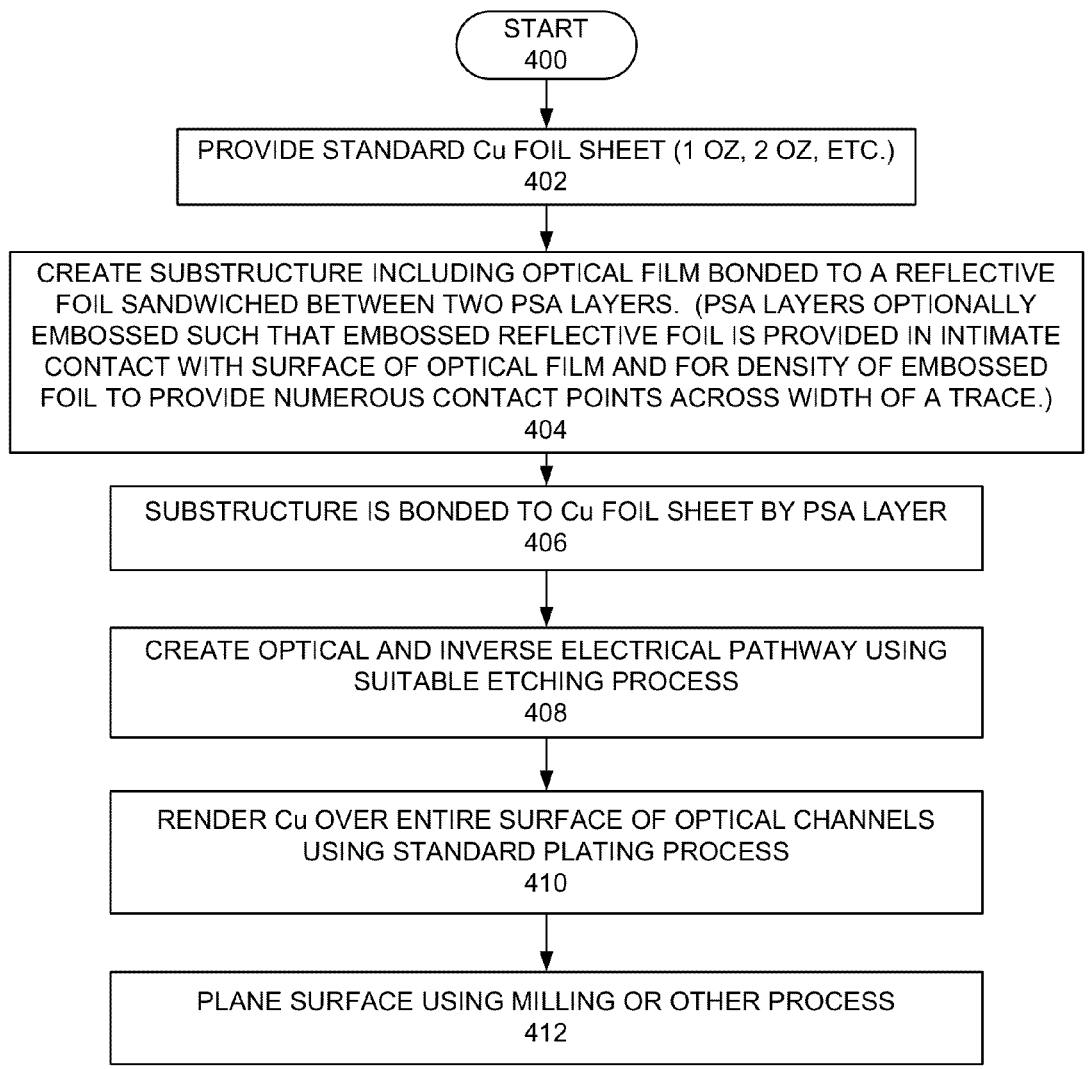
FIG. 4 is a flow chart illustrating example steps for manufacturing the embedded hybrid electrical-optical PCB construct of FIG. 1 in accordance with a preferred embodiment.

Referring to FIG. 4 there are shown example steps for manufacturing the embedded hybrid electrical-optical PCB construct 100 starting at a block 400 in accordance with a preferred embodiment. In a first step as indicated in a block 402, a standard copper foil sheet is provided, such as, 0.5 oz, 1 oz., 2 oz., and the like, where 0.5 oz Cu foil is typically 0.7 mils thick; 1 oz Cu foil is typically 1.4 mils thick; and 2 oz Cu foil is typically 2.8 mils thick.

In a second step a substructure is created including an optical film bonded to a reflective foil sandwiched between two pressure sensitive adhesive (PSA) layers, typically 0.5 mils thick PSA layers, as indicated in a block 404. The PSA layers can be embossed such that the reflective foil is provided in intimate contact with the optical film at block 404. Also the density of the embossed foil is selectively provided so that numerous contact points exist across a width of a trace at block 404.

In a third step the substructure is bonded to the copper foil sheet as indicated in a block 406. In a fourth step as indicated in a block 408, using any suitable etching process, optical and inverse electrical pathways are created. Next in a fifth step using a standard plating process, for example, including a seed and plate process, copper is rendered over the entire surface of the optical channels as indicated in a block 410. In a final sixth step as indicated in a block 412, the surface is planed using milling or other process.

As illustrated in FIG. 4, in accordance with features of the invention, the embedded hybrid electrical-optical PCB construct 100 maintains the use of existing PCB manufacturing processes.

The reflective foil of the substructure may be obtained from any of a number of copper foil suppliers. Among these, Rogers Corporation of Chandler, Ariz., manufactures several copper foils for high frequency circuit material constructions: (http://www.rogerscorp.com/documents/749/acm/Copper-Foils-for-High-Frequency-Circuit-Materials.aspx). Gould Electronics of Hauptstrasse 3 79356 Eichstetten, Germany also manufactures suitable copper foil: (http://www.gould.com/products/reverse-treated-copper/rtc/pub_export?lang=eng&export_format=pdfgould); or (http://www.gould.com/products/advanced-interconnect-foils/index_eng.html).

The optical film can be any suitable thermoplastic film with excellent transparency in the visible range of the electromagnetic spectrum. Suitable optical film is commercially available from 2-3 mils thick and can be thinner as a specialty film. Suitable films are polycarbonate (PC) or poly(methylmethacrlate) (PMMA). PC films are readily available from Sabic Innovative Plastics. More advanced, multilayer films are those marketing by 3M Optical Systems as their collimating multilayer optical films or 3M OneFilm: (http://solutions.3m.com/wps/portal/3M/en_US/NA_Optical/Systems/Technology/DisplayFilms/).

Several optically transparent PSAs are commecrially available, for instance, suitable materials are manufactured and sold by Drytac Facemount of Richmond, Va.: (http://www.drytac.com/mounting-adhesives/facemount.html); and 3M's optically clear laminating adhesives (http://solutions.3m.com/wps/portal/3M/en_US/electronics/home/productsand-services/pr oducts/ProductNavigator/TapeAdhesives/?PC_7_RJH9U5230GE3E02LECIE2OKH06000000_nid=HL9897BZX5beG7W0C8BLTFg1).

For ease of construction of the integrated construct 100, the preferred Cu foil thickness would be 1 oz Cu (range 0.5-2.0 oz.); the optical foil thickness would be 2 mils nominal (range 0.5-5 mils); and the PSA thickness would be 0.5 mils (range 0.5-5.0 mils). Please note that the optical foil/PSA may be obtained as a single subassembly. That is, you can purchase an optical film (such as PC or PMMA) with the double sided PSA already laminated to the optical film.

It should be understood that the embedded hybrid electrical-optical PCB construct 100 is not limited to the illustrated example materials, various other materials could be used in accordance with the present invention. For example, instead of a standard copper foil sheet, a copper plated with nickel sheet, or aluminum sheet, or other suitable material could be used in accordance with the present invention.

While the present invention has been described with reference to the details of the embodiments of the invention shown in the drawing, these details are not intended to limit the scope of the invention as claimed in the appended claims.

What is claimed is:

1. A structure for implementing an embedded hybrid electrical-optical printed circuit board (PCB) construct comprising:
   a plurality of electrical channels interleaved with a plurality of optical channels disposed within a single physical PCB layer;
   an electrically conductive sheet; and
   a reflective mesh adhesive layer disposed between said electrically conductive sheet and the electrical channels and optical channels within the single physical PCB layer.

2. The structure as recited in claim 1 wherein said electrically conductive sheet includes a copper sheet.

3. The structure as recited in claim 1 wherein each said electrical channel includes an electrically conductive material deposited adjacent said optical channel.

4. The structure as recited in claim 1 wherein each said electrical channel includes plated copper deposited adjacent said optical channel.

5. The structure as recited in claim 1 wherein said optical channel includes an optical pathway defined by optical film and reflective foil.

6. The structure as recited in claim 1 wherein said optical channel includes copper plating surface.

7. The structure as recited in claim 1 wherein said reflective mesh adhesive layer includes a pressure sensitive adhesive.

8. The structure as recited in claim 1 wherein said reflective mesh adhesive layer includes an optical film and reflective foil.

9. The structure as recited in claim 1 wherein said electrically conductive sheet is formed of a selected material from a group including copper, copper plated with nickel, and aluminum.

10. A method for implementing an embedded hybrid electrical-optical printed circuit board (PCB) construct comprising:
    providing an electrically conductive sheet;
    providing a reflective mesh adhesive layer disposed on said electrically conductive sheet within a single physical PCB layer; and
    providing a plurality of electrical channels interleaved with a plurality of optical channels disposed within the single physical PCB layer including said reflective mesh adhesive layer and said electrically conductive sheet.

11. The method as recited in claim 10 wherein providing said electrically conductive sheet includes providing a copper sheet.

12. The method as recited in claim 10 wherein providing said reflective mesh adhesive layer disposed on said electrically conductive sheet includes creating a substructure including bonding an optical film to a reflective foil.

13. The method as recited in claim 12 includes providing pressure sensitive adhesive (PSA) layers for sandwiching said optical film bonded to reflective foil between the PSA layers in said substructure.

14. The method as recited in claim 13 includes embossing said PSA layers to provide said optical film and said reflective foil in intimate contact.

15. The method as recited in claim 13 wherein providing said reflective mesh adhesive layer disposed on said electrically conductive sheet includes bonding said substructure to said electrically conductive sheet.

16. The method as recited in claim 15 wherein providing said electrical channel and said optical channel disposed within the single physical PCB layer including said reflective mesh adhesive layer and said electrically conductive sheet includes creating optical and inverse electrical pathways in said substructure using an etching process.

17. The method as recited in claim 16 includes providing a copper layer over each said optical channel using a plating process.

18. The method as recited in claim 17 includes providing each said electrical channel with plated copper deposited adjacent said optical channel.

\* \* \* \* \*